United States Patent
Petrie et al.

(10) Patent No.: US 11,408,945 B2
(45) Date of Patent: Aug. 9, 2022

(54) MAGNETIC FIELD SENSOR WITH STACKED TRANSDUCERS AND CAPACITIVE SUMMING AMPLIFIER

(71) Applicant: Allegro MicroSystems, LLC, Manchester, NH (US)

(72) Inventors: Craig S. Petrie, Merrimack, NH (US); Hernán D. Romero, Buenos Aires (AR); David J. Haas, Concord, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 6 days.

(21) Appl. No.: 16/951,324

(22) Filed: Nov. 18, 2020

(65) Prior Publication Data
US 2022/0155387 A1    May 19, 2022

(51) Int. Cl.
*G01R 33/00*    (2006.01)
*G01R 33/07*    (2006.01)

(52) U.S. Cl.
CPC ..... *G01R 33/0041* (2013.01); *G01R 33/0029* (2013.01); *G01R 33/077* (2013.01)

(58) Field of Classification Search
CPC .................. G01R 33/02–10; G01D 5/12–2525
See application file for complete search history.

(56) References Cited

U.S. PATENT DOCUMENTS

| | | |
|---|---|---|
| 5,245,262 A | 9/1993 | Moody et al. |
| 5,621,319 A | 4/1997 | Bilotti et al. |
| 7,425,821 B2 | 9/2008 | Monreal et al. |
| 7,768,083 B2 | 8/2010 | Doogue et al. |
| 7,936,144 B2 | 5/2011 | Vig et al. |
| 7,990,209 B2 | 8/2011 | Romero |
| 8,008,908 B2 | 8/2011 | Doogue et al. |
| 8,138,708 B2 | 3/2012 | Ward et al. |

(Continued)

OTHER PUBLICATIONS

Banjevic "High Bandwidth CMOS Magnetic Sensors Based on the Miniaturized Circular Vertical Hall Device", Thesis Ecole Polytechnique Federale de Lausanne, Sep. 9, 2011, 153 pages.

(Continued)

*Primary Examiner* — Huy Q Phan
*Assistant Examiner* — David B Frederiksen
(74) *Attorney, Agent, or Firm* — Daly, Crowley, Mofford & Durkee, LLP (57) ABSTRACT

A magnetic field sensor includes a current source configured to generate a bias current, a plurality of magnetic field transducers, each having power terminals coupled to the current source and output terminals at which an output signal of the transducer is provided, wherein the power terminals of each of the plurality of magnetic field transducers are electrically coupled together in series so that the bias current flows through each of the plurality of magnetic field transducers in series. A capacitively-coupled summing amplifier has a plurality of inputs, each configured to receive the output signal of a respective one of the plurality of magnetic field transducers, and an output at which an amplified and summed signal is provided, wherein the capacitively-coupled summing amplifier is configured to amplify and sum the received output signals of the plurality of magnetic field transducers.

20 Claims, 6 Drawing Sheets

(56) References Cited

U.S. PATENT DOCUMENTS

| | | | |
|---|---|---|---|
| 8,222,888 | B2 | 7/2012 | David et al. |
| 8,416,014 | B2 | 4/2013 | Romero |
| 8,564,285 | B2 | 10/2013 | Romero et al. |
| 8,629,520 | B2 | 1/2014 | Doogue et al. |
| 8,922,206 | B2 | 12/2014 | Friedrich et al. |
| 8,952,471 | B2 | 2/2015 | Doogue et al. |
| 9,082,957 | B2 | 7/2015 | Doogue et al. |
| 9,411,023 | B2 | 8/2016 | Friedrich et al. |
| 9,625,534 | B2 | 4/2017 | Cadugan et al. |
| 9,733,106 | B2 | 8/2017 | Judkins, III et al. |
| 9,859,489 | B2 | 1/2018 | Doogue et al. |
| 9,897,464 | B2 | 2/2018 | Judkins, III et al. |
| 10,069,063 | B2 | 9/2018 | Doogue et al. |
| 10,132,879 | B2 | 11/2018 | Latham et al. |
| 10,520,559 | B2 | 12/2019 | Cesaretti et al. |
| 2012/0095361 | A1* | 4/2012 | Xu ............... H03F 3/45928 600/547 |
| 2012/0239350 | A1* | 9/2012 | Motz ............... H03M 1/12 702/190 |
| 2013/0342194 | A1* | 12/2013 | Motz ............... G01R 33/077 324/251 |
| 2014/0009144 | A1* | 1/2014 | Romero ............. G01R 33/0041 324/251 |
| 2014/0117981 | A1* | 5/2014 | Kurumado ............. G01D 5/145 324/207.21 |
| 2015/0048820 | A1* | 2/2015 | Schaffer ............. G01R 33/0023 324/253 |
| 2015/0301149 | A1* | 10/2015 | Cesaretti ............. G01R 35/005 324/202 |
| 2016/0252590 | A1* | 9/2016 | Diaconu ............... G01R 33/077 324/251 |
| 2017/0317622 | A1* | 11/2017 | Cai ........................ G01R 33/07 |
| 2018/0252779 | A1* | 9/2018 | Romero ............. G01R 33/0029 |
| 2019/0302196 | A1* | 10/2019 | Cook ................. G01R 33/0029 |
| 2021/0018576 | A1 | 1/2021 | Latham et al. |

OTHER PUBLICATIONS

Fan et al. "A 1.8 µ W 60 nV/ √Hz Capacitively-Coupled Chopper Instrumentation Amplifier in 65 nm CMOS for Wireless Sensor Nodes", IEEE Journal of Solid State Circuits, vol. 46, No. 7, Jul. 2011, 10 pages.

Stoica et al. "A Dual Vertical Hall Latch with Direction Detection", IEEE Jan. 2013, 4 pages.

Texas Instruments TMAG5170-Q1 "3-Axis Linear Hall Effect Sensor with SPI Interface" Datasheet, Jun. 2020, 45 pages.

Melexis Datasheet "MLX90371—Triaxis® Position Processor", Revision 004, Mar. 2019, 68 pages.

Melexis Datasheet "MLX90372—Triaxis® Position Processor", Revision 8, Mar. 8, 2019, 85 pages.

Melexis Application Note "Magnet Selection for MLX9037X—Rotary Stray-Field Immune Mode", Revision 001, 2017, 10 pages.

* cited by examiner

MAGNETIC FIELD SENSOR WITH STACKED TRANSDUCERS AND CAPACITIVE SUMMING AMPLIFIER

CROSS REFERENCE TO RELATED APPLICATIONS

Not Applicable.

STATEMENT REGARDING FEDERALLY SPONSORED RESEARCH

Not Applicable.

FIELD

This disclosure relates generally to magnetic field sensors and more particularly, to magnetic field effect sensors having electrically stacked magnetic field transducers and a capacitively-coupled summing amplifier.

BACKGROUND

As is known, magnetic field sensors are used in a variety of applications. In motion (e.g., rotation) detector circuits, for example, a magnetic field sensor may be used to detect motion of an object, such as a gear or ring magnet. A magnetic field affected by motion of the object may be sensed by the magnetic field sensor. In response to the sensed magnetic field, the magnetic field sensor may provide signals (e.g., magnetic field sensor output signals) proportional to the sensed magnetic field. Such signals can be processed to detect motion of the object, such as speed of motion, direction of motion, and angle of the object.

Magnetic field sensors employ one or more magnetic field sensing elements or transducers, for example, Hall effect elements or magnetoresistance elements to sense magnetic fields in one or more axes. For example, some magnetic field sensors (referred to herein as "one-dimensional" or "1D" magnetic field sensors) sense magnetic fields in a single axis and some magnetic field sensors (referred to herein as "two-dimensional" or "2D" magnetic field sensors) can sense magnetic fields in two different axes. Other magnetic field sensors (referred to herein as "three-dimensional" or "3D" magnetic field sensors) can sense magnetic fields in three different axes and are sometimes referred to as magnetometers.

A magnetic field sensor can be characterized by a variety of performance characteristics, including a sensitivity, which can be expressed in terms of an output signal amplitude versus a magnetic field strength to which the magnetic field sensing element(s) are exposed. The sensitivity of a magnetic field sensor is established by the individual sensitivities of the sensing elements and can be based, at least in part, on the material of the elements and/or a level of bias current applied to the elements.

Application requirements sometimes limit the amount of power available for the magnetic field sensor. One way to reduce power consumption in a magnetic field sensor containing a plurality of sensing elements is to have the elements share a bias current. In such configurations, power terminals of the transducers are coupled in series so that the same bias current flows through each of the transducers in series.

Magnetic field transducers can exhibit an undesirable DC offset voltage. One technique to reduce DC offset voltage is commonly referred to as "chopping" or "current spinning" and entails driving a magnetic field transducer in two or more different directions during different portions of a clock cycle and receiving output signals at different output terminals of the transducer during the different portions of the clock cycle. In this way, power and output terminals are interchanged during each phase of the chopping and offset voltages associated with the different driving arrangements tend to cancel.

SUMMARY

Described herein are embodiments of a magnetic field sensor having a plurality of magnetic field sensing elements with power terminals coupled together in series and to a bias current source so that the bias current flows through each of the transducers in series (i.e., the plurality of transducers can be considered "electrically stacked") so as to reduce power consumption (as compared to providing the same current level to parallel coupled transducers). Chopping is applied to the transducer output signals and the chopped transducer output signals are summed together by a capacitively-coupled summing amplifier in order to recover sensitivity otherwise lost by using a relatively low bias current. The capacitively-coupled summing amplifier is configured to sum and amplify the transducer output signals in a low power manner that advantageously utilizes the chopped transducer output signals.

According to the disclosure, a magnetic field sensor includes a current source configured to generate a bias current, a plurality of magnetic field transducers, each having power terminals coupled to the current source and output terminals at which an output signal of the transducer is provided, wherein the power terminals of each of the plurality of magnetic field transducers are electrically coupled together in series so that the bias current flows through each of the plurality of magnetic field transducers in series. A capacitively-coupled summing amplifier has a plurality of inputs, each configured to receive the output signal of a respective one of the plurality of magnetic field transducers, and an output at which an amplified and summed signal is provided, wherein the capacitively-coupled summing amplifier is configured to amplify and sum the received output signals of the plurality of magnetic field transducers.

Features may include one or more of the following individually or in combination with other features. A modulation circuit can be coupled between the plurality of magnetic field transducers and the inputs of the capacitively-coupled summing amplifier, wherein the modulation circuit is configured to chop the output signal of each of the magnetic field transducers at a chopping frequency. A demodulation circuit can be configured to demodulate the amplified and summed signal at the chopping frequency to generate a demodulated signal. The power terminals of adjacent ones of the plurality of magnetic field transducers are rotated by ninety-degrees with respect to each other. The sensor can further include a transconductance amplifier having an input coupled to receive the demodulated signal and an output at which a voltage signal is provided, an analog-to-digital converter configured to convert the voltage signal into digital signal, and a filter coupled to receive the digital signal and configured to generate a filtered signal indicative of a magnetic field to which the plurality of magnetic field transducers are subjected. A trim circuit can be coupled to receive the filtered signal and configured to compensate for offset and gain errors in the filtered signal. The sensor may further include a temperature sensor and the trim circuit can be configured to compensate for offset and gain errors caused by temperature variation.

The plurality of magnetic field transducers can include Hall effect elements and/or magnetoresistance elements. The plurality of magnetic field transducers are oriented to have a maximum response along a first axis. The plurality of magnetic field transducers can provide a first plurality of magnetic field transducers and the magnetic field sensor can further include a second plurality of magnetic field transducers having a maximum response axis along a second axis that is orthogonal with respect to the first axis. In embodiments, the first plurality of magnetic field transducers can include vertical Hall effect elements and the second plurality of magnetic field transducers can include planar Hall effect elements. In embodiments, the first plurality of magnetic field transducers and the second plurality of magnetic field transducers can include vertical Hall effect elements. The plurality of magnetic field transducers can provide a first plurality of magnetic field transducers and the magnetic field sensor can further include a second plurality of magnetic field transducers having a maximum response axis along a second axis that is orthogonal with respect to the first axis and a third plurality of magnetic field transducers having a maximum response axis along a third axis that is orthogonal with respect to the first and second axes. The first plurality of magnetic field transducers can include planar Hall effect elements and the second plurality of magnetic field transducers and the third plurality of magnetic field transducers can include vertical Hall effect elements.

Also described is a magnetic field sensor including means for generating a bias current and means for sensing a magnetic field with a plurality of magnetic field transducers having power terminals coupled together in series and configured to receive the bias current and having output terminals at which a transducer output signal is provided. The magnetic field sensor further includes means for modulating the transducer output signals of the plurality of magnetic field transducers to generate modulated signals, means for amplifying and summing the modulated signals to generate an amplified and summed signal, and means for demodulating the amplified and summed signal.

BRIEF DESCRIPTION OF THE DRAWINGS

The foregoing features of the disclosure, as well as the disclosure itself may be more fully understood from the following detailed description of the drawings, in which like reference numerals identify similar or identical elements.

DETAILED DESCRIPTION

Before describing the present disclosure, some introductory concepts and terminology are explained.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to the surface of a substrate that supports the magnetic field sensing element, and others of the above-described magnetic field sensing elements tend to have an axis of maximum sensitivity perpendicular to the surface of a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

Figure 1:
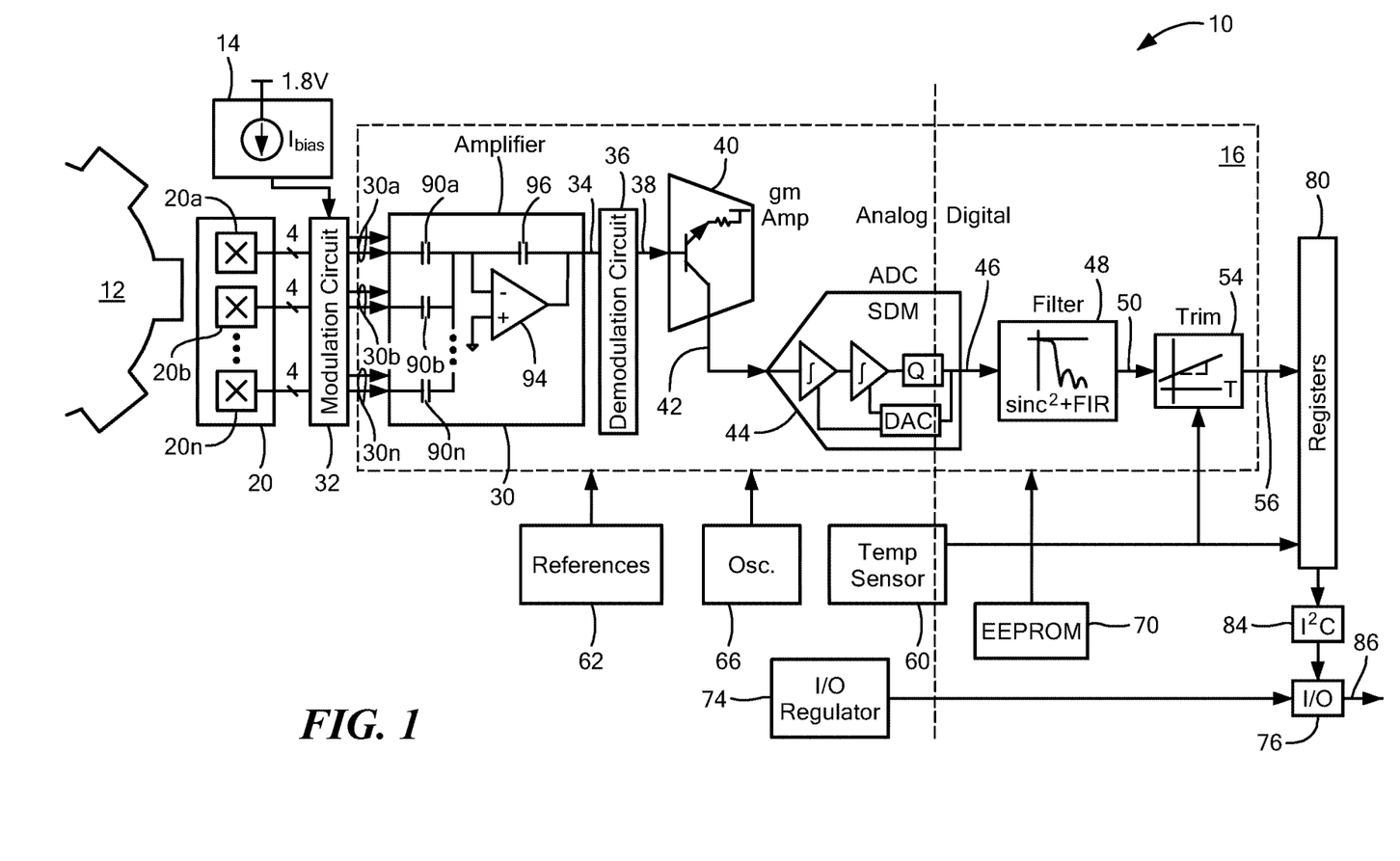
FIG. 1 is a block diagram of a magnetic field sensor according to the disclosure.

Referring to FIG. 1, a magnetic field sensor 10 includes a current source 14 configured to generate a bias current Ibias and a plurality of magnetic field transducers 20 including transducers 20a, 20b, . . . 20n having power terminals coupled to the current source 14 and output terminals at which an output signal of the transducer is provided. As will be described in connection with FIG. 2, the power terminals of each of the plurality of magnetic field transducers 20a, 20b, . . . 20n are coupled to the current source 14 through a modulation circuit 32 and are electrically coupled together in series so that the bias current Ibias flows through each of the plurality of magnetic field transducers in series. Such an electrical coupling between the transducers 20a, 20b, . . . 20n can be referred to as "electrical stacking" as will be described.

Sensor 10 further includes a capacitively-coupled summing amplifier, or simply amplifier 30 having a plurality of inputs, each configured to receive a modulated transducer output signal 30a, 30b, . . . 30n and an output at which an amplified and summed signal 34 is provided. The transducers 20a, 20b, . . . 20n can be chopped, or modulated by modulation circuit 32 to generate the modulated transducer output signals 30a, 30b, . . . 30n, each generated by modulating the output of a respective one of the plurality of magnetic field transducers 20a, 20b, . . . 20n. The amplified and summed signal 34 can be demodulated by a demodulation circuit 36.

With this arrangement, power consumption is minimized by having the plurality of magnetic field transducers 20a, 20b, . . . 20n coupled in series to the bias current source 14 and the sensor sensitivity that would otherwise be reduced by using a relatively low bias current is recovered by summing together the output signals of the transducers. Chopping is applied to the transducers 20a, 20b, . . . 20n to reduce offset errors and, advantageously, generates chopped transducer output signals 30a, 30b, . . . 30n that are suitable for coupling to inputs of the amplifier 30 that sums and amplifies the signals in a low power manner and without requiring chopping for the sole purpose of generating input signals for the amplifier 30. In other words, chopping implemented by modulation circuit 32 serves dual purposes of reducing offset errors associated with transducer offset voltages and providing input signals suitable for the capacitive-coupling of the amplifier 30 inputs. Stated differently, since the capacitive inputs of amplifier 30 only pass the AC component of the input signals, the amplifier requires AC input signals, which AC signals are conveniently the type of signals provided by modulation circuit 32. Amplifier 30 provides a relatively low power summation solution because its plurality of capacitively-coupled inputs do not consume additional power.

Transducers 20a, 20b, . . . 20n have the same axis of maximum sensitivity. Thus, the sensor 10 can be considered a one-dimensional sensor such that a signal path 16 processes magnetic field signals indicative of magnetic field components aligned with the axis of maximum sensitivity. It will be appreciated that the concepts described herein can be applied to sensors that operate in more than one dimension. For example, in the case of a two-dimensional sensor, transducers 20 can provide a first plurality of transducers having a first axis of maximum sensitivity (e.g., the so-called x-axis) and a second plurality of transducers can be provided with a second axis of maximum sensitivity (e.g., the so-called y-axis) that can be orthogonal to the first axis. An example three-dimensional sensor is shown and discussed in connection with FIG. 4 in which three pluralities of transducers are provided, with each such plurality having a different axis of maximum sensitivity that is orthogonal with respect to the other axes of maximum sensitivity.

Transducers 20a, 20b, . . . 20n may or may not be the same types of elements, even while having a common axis of maximum sensitivity. In an example embodiment, each of the transducers 20a, 20b, . . . 20n is a planar Hall effect element.

While transducers 20a, 20b, . . . 20n are illustrated to be Hall effect elements, it will be appreciated that the concepts described herein can be applied to sensors containing other types of magnetic field transducers. In general, transducers 20a, 20b, . . . 20n can be any type that is configured to have a bias current passed through it. As one non-limiting example, transducers 20a, 20b, . . . 20n can contain magnetoresistance elements, such as four such elements electrically coupled between the four terminals of the transducer in a Wheatstone bridge configuration. For example, in such a Wheatstone bridge, two MR elements can be sensitive in one direction and two in an opposite direction or two MR elements can be positioned proximal to the magnetic field of interest and two can be positioned distal from the magnetic field of interest.

In use, sensor 10 is configured to be positioned proximate to a movable target 12 so as to sense a magnetic field affected by movement of the target and thus, detect the target movement. The target motion can be linear or rotational for example. Transducers 20a, 20b, 20n are located in physical proximity to one another (e.g., in a cluster) so as to be exposed to as close to the same magnetic field of interest as possible. Target 12 can take various forms. Sensor 10 can include a permanent magnet disposed within or proximate to the sensor package in a so-called "back-biased" arrangement. In a back-biased arrangement, the target 12 can be ferromagnetic and sensor 10 experiences changes of magnetic field generated by the permanent magnet as the target 12 moves (e.g., rotates). Alternatively, target 12 can be a magnet that generates a magnetic field that varies as the target moves for detection by sensor 10, in which case the back-bias magnet can be omitted. By way of one non-limiting example, target 12 can take the form of a so-called ring magnet having magnetic domains that are detected by the magnetic field sensor 10.

Modulation circuit 32 is described in greater detail in connection with the example modulation circuit of FIGS. 3 and 3A. Suffice it to say here that modulation circuit 32 is configured to chop the output signals of transducers 20a, 20b, . . . 20n. While the number "n" of transducers of the plurality of transducers 20 can be two or any number greater than two, "n" can be selected based on various factors and constraints, such as sensitivity improvement, supply voltage, maximum bias current Ibias, and power constraints. For example, although it may be desirable to have a larger number of transducers "n" for sensitivity reasons, the number "n" can be dictated by how many transducers can be stacked for a particular supply voltage level, given the voltage drop across each transducer that will occur using the maximum allowable bias current while staying with applicable power constraints. Further, the number of transducers "n" should be divisible by the number of chopping phases. For example, if there are two or four chopping phases, the number "n" should be divisible by two or four, respectively, so that the chopping phases can be equally represented in the transducer stack.

As noted above, amplifier 30 is configured to receive the chopped transducer output signals 30a, 30b, . . . 30n at respective inputs and to sum and amplify such signals to generate output signal 34. The amplifier 30 is shown in a general, simplified, single-ended form in FIG. 1 to include a plurality of input capacitors 90a, 90b, . . . 90n each coupled to receive a respective modulated transducer output signal 30a, 30b, . . . 30n, an amplifier 94 having an inverting input coupled to each of the input capacitors 90a, 90b, . . . 90n, and a feedback capacitor 96. A more detailed example amplifier 30 is shown and described in connection with FIGS. 3 and 3A in which amplifier 30 is shown in a differential form.

As noted above, amplifier 30 is a relatively low power solution to summing together the modulated transducer output signals 30a, 30b, . . . 30n since additional inputs do not necessarily consume additional power. Further, the feedback capacitor 96 of amplifier 30 is selected to match the input capacitance of capacitors 90a, 90b, . . . 90n and in this way provides the amplifier 30 with a stable gain.

Signal path 16 can include additional components for processing the modulated, summed and amplified transducer output signals 30a, 30b, . . . 30n in order to generate a sensor output signal 86. It will be appreciated that although signal path components are here shown in a simplified, single-ended form, but can be implemented as differential elements receiving and generating differential signals. The demodulated output signal 38 of the demodulation circuit 36 can be converted into a current signal 42 by a transconductance amplifier 40 having an output coupled to an analog-to-digital converter (ADC) 44. The ADC 44 can take various forms, such as the illustrated sigma-delta modulator. A digitized output signal 46 of the ADC 44 can be filtered by a filter 48 and the filtered signal 50 can be coupled to a trim circuit 54. Filter 48 can be designed to remove high frequency (i.e., wideband thermal) noise and quantization noise associated with the ADC 44. Trim circuit 54 can compensate for offset and/or gain errors in the output signals from the transducers 20, as may vary over temperature. To this end, sensor 10 can include a temperature sensor 60.

Additional components of the sensor 10 can include references 62 as may generate one or more reference signals as may provide reference voltages for the ADC 44 and for reference bias currents. An oscillator 66 can generate one or more oscillation signals at predetermined frequencies, such as the chopping frequency fchop. A memory, such as EEPROM 70, can store programmable parameter values, such as gain correction coefficients and offset correction coefficients. An I/O regulator 74 can generate a reference supply voltage for driving an I/O circuit 76 for interfacing with external circuitry.

Registers 80 can store sensor output signal values for coupling to and communication through an output driver circuit such as an Inter-Integrated Circuit (I$^2$C) circuit 84 in embodiments in which the sensor output signal 86 is provided in I$^2$C format. It will be appreciated by those of ordinary skill in the art that the sensor output signal 86 can be provided in various formats, including, but not limited to PWM format, Single Edge Nibble Transmission (SENT) format, a Serial Peripheral Interface (SPI) format, a Local Interconnect Network (LIN) format, and a CAN (Controller Area Network) format.

Depending on the particular application for sensor 10, the sensor output signal 86 can simply represent summed and conditioned output signals of the transducers 20a, 20b, . . . 20n and further processing of such signals can be performed "off-chip" in a controller or other component or system to which the sensor 10 is coupled in use, such as an engine control unit in the case of an automotive application for example. Alternatively, such further processing can be performed by the sensor 10 (e.g., as part of the trim circuit 54). Such further processing can generate signals indicative of various characteristics the position and/or movement of target 12. For example, signal 86 can be indicative of a speed of motion of target 12, a direction of motion of target 12, and/or an angle of target 12. Various techniques are possible for determining such characteristics. For example, target angle can be computed using CORDIC processing and target speed can be computed as the derivative of target angle. In some embodiments, sensor output signal 86 can include diagnostic information.

Sensor 10 can be provided in the form of an integrated circuit (IC) as may contain one or more semiconductor substrates or die within the same IC package or in additional IC packages and/or on circuit boards or other substrates to support the circuitry. While the magnetic field sensor 10 may be provided in the illustrated form of an IC with an analog front end portion and a digital portion, it will be appreciated that the particular delineation of which circuit functions are implemented in an analog fashion or with digital circuitry and signals can be varied. Some of the illustrated circuit functions can be implemented on an integrated circuit sensor 10 and other circuitry and functionality can be implemented on separate circuits (e.g., additional substrates within the same integrated circuit package, or additional integrated circuit packages, and/or on circuit boards).

Figure 2:
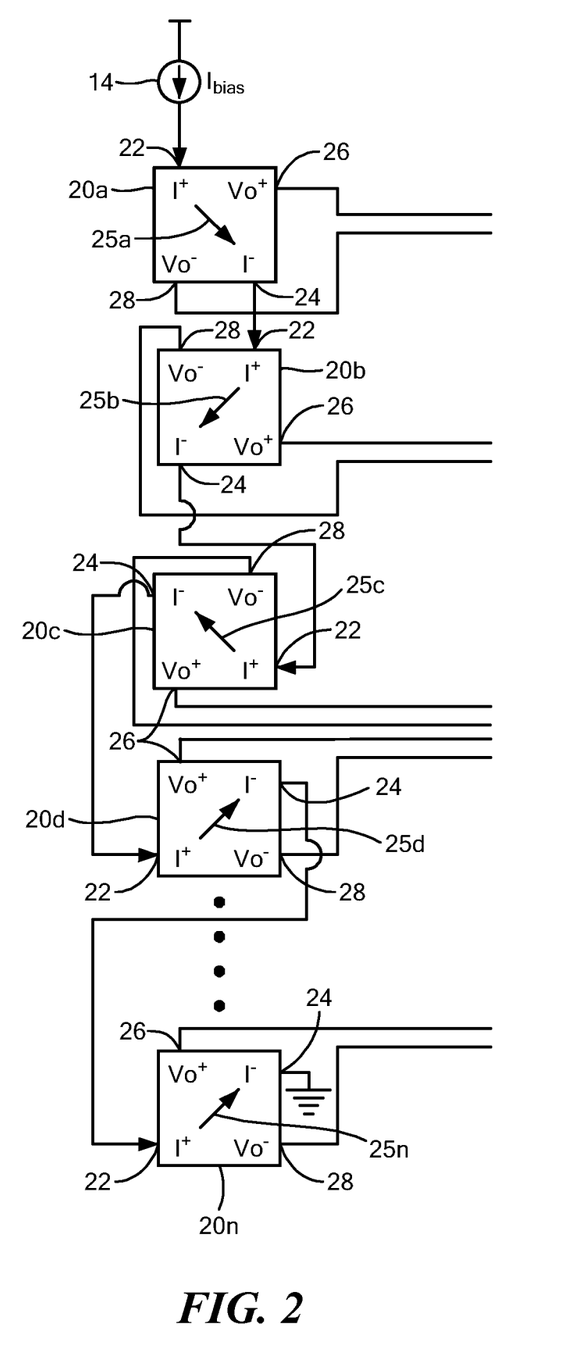
FIG. 2 is a block diagram of a plurality of magnetic field transducers of the sensor of FIG. 1.

Referring also to FIG. 2, the plurality of magnetic field transducers 20a, 20b, . . . 20n are shown having power terminals (i.e., positive power terminals I$^+$22 and negative power terminals I$^-$ 24) coupled to the current source 14 and output terminals (i.e., positive output terminals Vo$^+$ 26 and negative output terminals Vo$^-$ 28) at which an output signal of the transducer is provided. FIG. 2 illustrates a generalized configuration of "n" transducers where "n" is a multiple of four.

As illustrated in FIG. 2, the power terminals 22, 24 of each of the plurality of magnetic field transducers 20a, 20b, . . . 20n are electrically coupled together in series so that the bias current Ibias flows through each of the plurality of magnetic field transducers in series. In other words, the bias current Ibias enters transducer 20a at the positive power terminal I$^+$ and exits the transducer 20a at the negative power terminal I$^-$, enters transducer 20b at the positive power terminal I$^+$ and exits the transducer 20b at the negative power terminal I$^-$, and so forth. Such an electrical coupling between the transducers 20a, 20b, . . . 20n can be referred to as "electrical stacking".

Furthermore, power terminals 22, 24 of adjacent ones of the plurality of magnetic field transducers 20a, 20b, . . . 20n are rotated by ninety-degrees with respect to each other, as shown. In other words, the function of the terminals of adjacent transducers is rotated by ninety-degrees, such that the current flow (illustrated by arrows 25a, 25b, . . . 25n) through adjacent transducers is rotated by ninety-degrees. This arrangement can be considered to provide a "spatial chopping" scheme whereby the direction of current flow 25a, 25b, . . . 25n in adjacent transducers 20a, 20b, . . . 20n is rotated by ninety-degrees and can be advantageous in order to further reduce offset of the transducer stack 20 as may occur when the modulated transducer output signals are summed.

Figure 3:
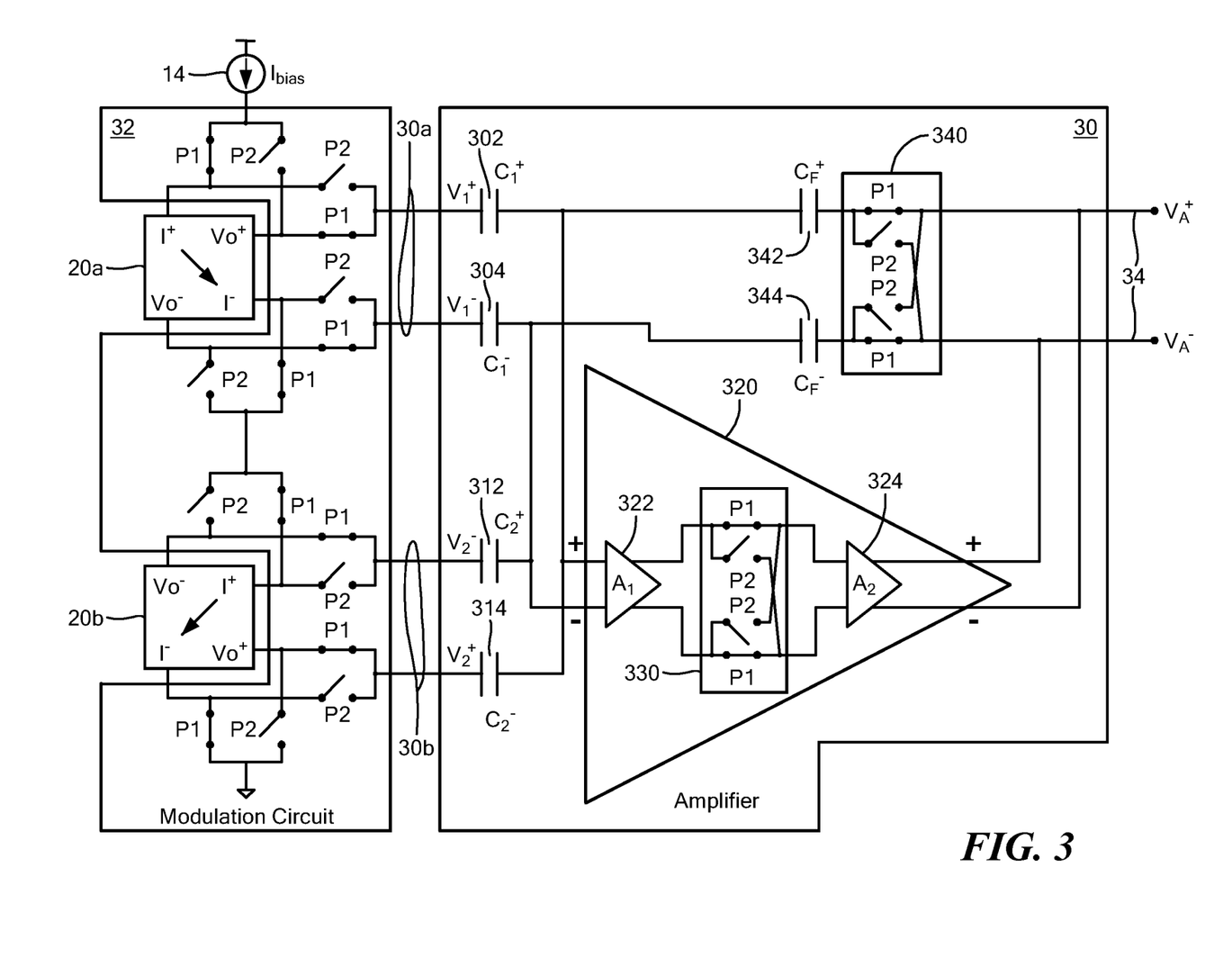
FIG. 3 is a more detailed block diagram of a portion of the magnetic field sensor of FIG. 1 illustrating operation during a first chopping phase.
Figure 3A:
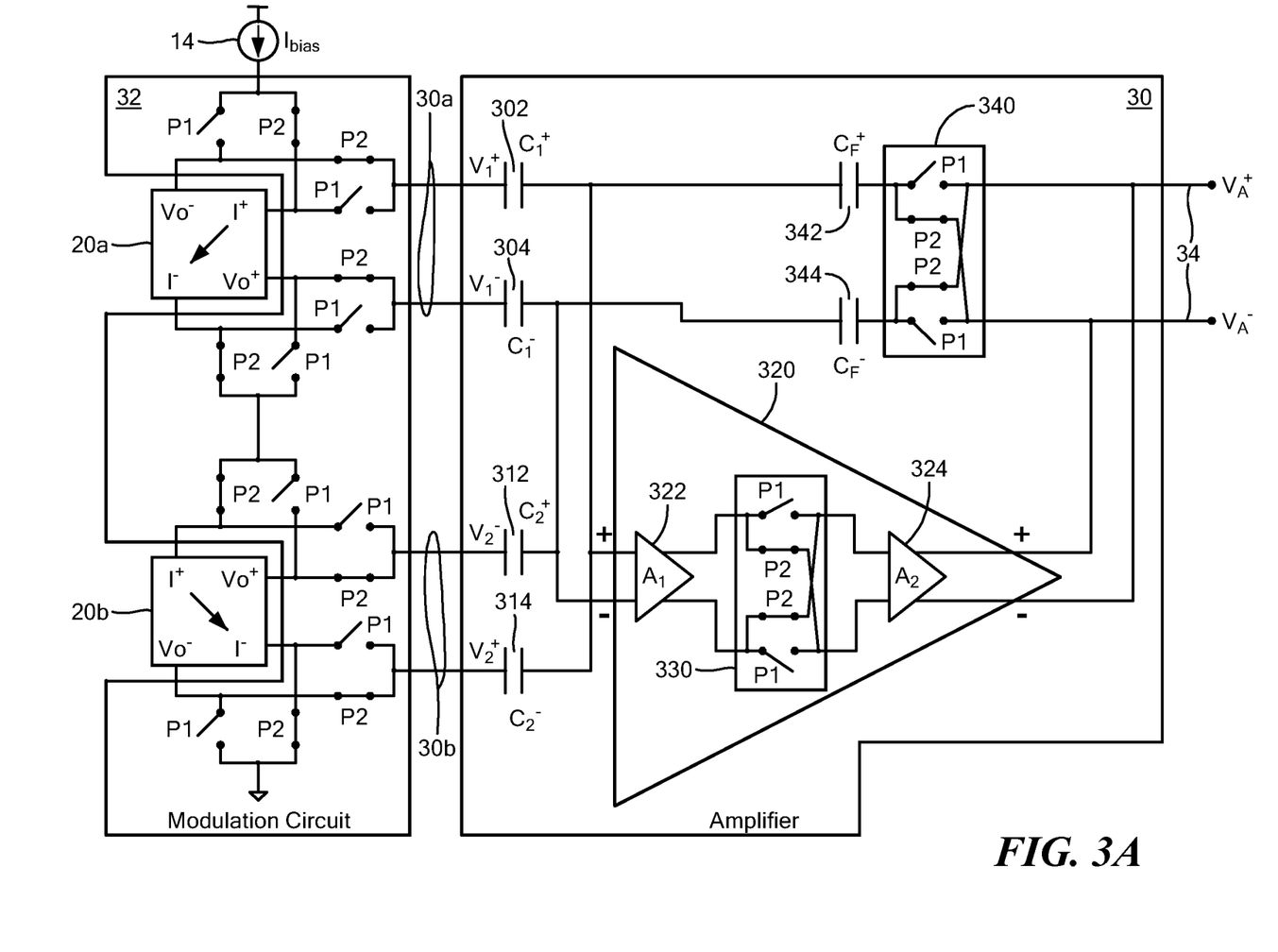
FIG. 3A is a more detailed block diagram of a portion of the magnetic field sensor of FIG. 1 illustrating operation during a second chopping phase.

Referring also to FIGS. 3, 3A, a portion of sensor 10 is shown to illustrate chopping of the transducer output signals by modulation circuit 32 and coupling of the modulated transducer output signals to respective inputs of the capacitively-coupled summing amplifier 30. FIGS. 3 and 3A are simplified to include only two transducers 20a, 20b and two-phase chopping, with the modulated transducer output signals 30a, 30b coupled to respective inputs of amplifier 30. It will be appreciated by those of ordinary skill in the art however that more than two transducers and/or chopping phases (e.g., four chopping phases) are possible.

Modulation circuit 32 includes an input coupled to the bias current source 14 to receive the bias current Ibias and, for each transducer, four input terminals configured to be coupled to the power and output terminals of a respective transducer, as shown. Modulated transducer output signals 30a, 30b are provided at differential output terminals of the modulation circuit 32 for coupling to respective inputs of the amplifier 30.

Modulation circuit 32 includes a plurality of switches, some labeled P1 and some labeled P2, with such labels corresponding to first and second chopping phases, respectively. FIG. 3 illustrates operation during a first portion of each clock cycle, or first chopping phase, during which switches P1 are closed and switches P2 are open. FIG. 3A illustrates operation during a second portion of each clock cycle, or second chopping phase, during which switches P2 are closed and switches P1 are open. In this explanation, P1 and P2 together form one chopping cycle, or 1/fchop.

Amplifier 30 includes input capacitors 302, 304 coupled to receive differential modulated transducer output signal 30a, and input capacitors 312, 314 coupled to receive differential modulated transducer output signal 30b, as shown. The input capacitors 302, 304, 312, 314 are coupled to inputs of amplifier unit 320. The differential output signal 34 of the amplifier 30 is provided at the output of amplifier unit 320. In the example embodiment, amplifier unit 320 has two gain stages 322, 324 with a switch circuit, or chopper 330 coupled between the gain stages. A feedback circuit of the amplifier 30 includes a further switch circuit, or chopper 340 and feedback capacitors 342, 344, with such feedback circuit coupled between the outputs and inputs of amplifier unit 320, as shown. Signal inversion in the feedback path by chopper 340 is required in order to maintain negative feedback around the amplifier unit 320.

During the first chopping phase illustrated by the switch positions of FIG. 3, the transducer output signal 30a is provided across the Vo$^+$, Vo$^-$ terminals of transducer 20a and the transducer output signal 30b is provided across the Vo$^+$, Vo$^-$ terminals of transducer 20b; whereas during the second chopping phase illustrated by the switch positions of FIG. 3A, the transducer output signal 30a is provided across the Vo$^-$, Vo$^+$ terminals of transducer 20a and the transducer output signal 30b is provided across the Vo$^-$, Vo$^+$ terminals of transducer 20b. In this way, the amplifier input signals 30a, 30b are inverted during alternating chopping phases.

For ease of explanation, the differential input signal 30a may be referred to as V1, the differential input signal 30b may be referred to as V2, and the differential output signal 34 may be referred to as VA. Thus, using this nomenclature, consideration of FIGS. 3 and 3A reveals that V1 and V2 are inverted every other phase.

During the first chopping phase, the positive differential signal from terminals Vo$^+$, Vo$^-$ of transducer 20a is connected to amplifier differential inputs V1$^+$, V1$^-$ and the positive differential signal from terminals Vo$^+$, Vo$^-$ of transducer 20b is connected to amplifier differential inputs V2$^+$, V2$^-$. The amplifier 30 sums and amplifies its positive inputs and its output VA is positive. In particular, VA is the sum of the two amplified inputs V1 and V2. In particular:

$$VA = K1 \times V1 + K2 \times V2$$

where K1=CF/C1 and K2=CF/C2. The value of capacitors 302 and 304 may be the same as capacitors 312 and 314.

During the second chopping phase, the negative differential signal from terminals Vo$^-$, Vo$^+$ of transducer 20a is connected to amplifier differential inputs V1$^+$, V1$^-$ and the negative differential signal from terminals Vo$^-$, Vo$^+$ of transducer 20b is connected to amplifier differential inputs V2$^+$, V2$^-$. The amplifier 30 produces the inverse of the sum of its two amplified inputs, each of which is negative, and therefore the output VA of the amplifier is still positive. In particular:

$$VA = -(K1 \times V1 + K2 \times V2)$$

where K1=CF/C1 and K2=CF/C2.

Thus, by operation of the signal inversion by modulation circuit 32, the amplifier output VA is continuously positive. Without modulation circuit 32, amplifier 30 would require input chopping switches to generate an inversion to achieve a continuously positive output signal.

Figure 3B:
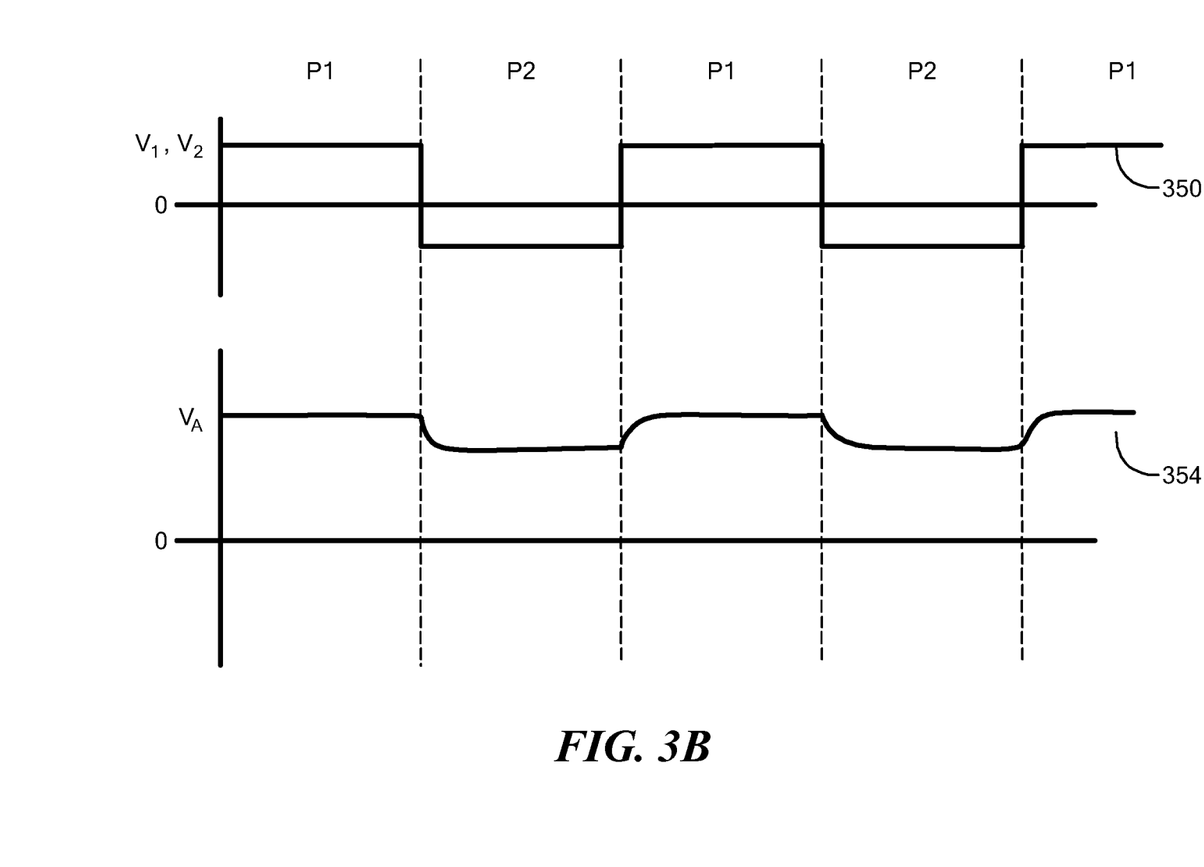
FIG. 3B shows several waveforms associated with the chopping phases of FIGS. 3 and 3A.

Referring also to FIG. 3B, in which the horizontal axis corresponds to arbitrary units of time and the vertical axis corresponds to voltage, example modulated transducer output signals 30a, 30b are shown by waveform 350 and the amplifier output signal 34 is shown by waveform 354 during each chopping phase (with the first phase labeled P1 and the second phase labeled P2). Consideration of waveform 350 illustrates that some transducer offset exists since V1 and V2 are not centered at zero. The output signal 34 of the amplifier is shown in waveform 354 to be an amplified, demodulated signal, with offset (also amplified) modulated at the chopping frequency.

Figure 4:
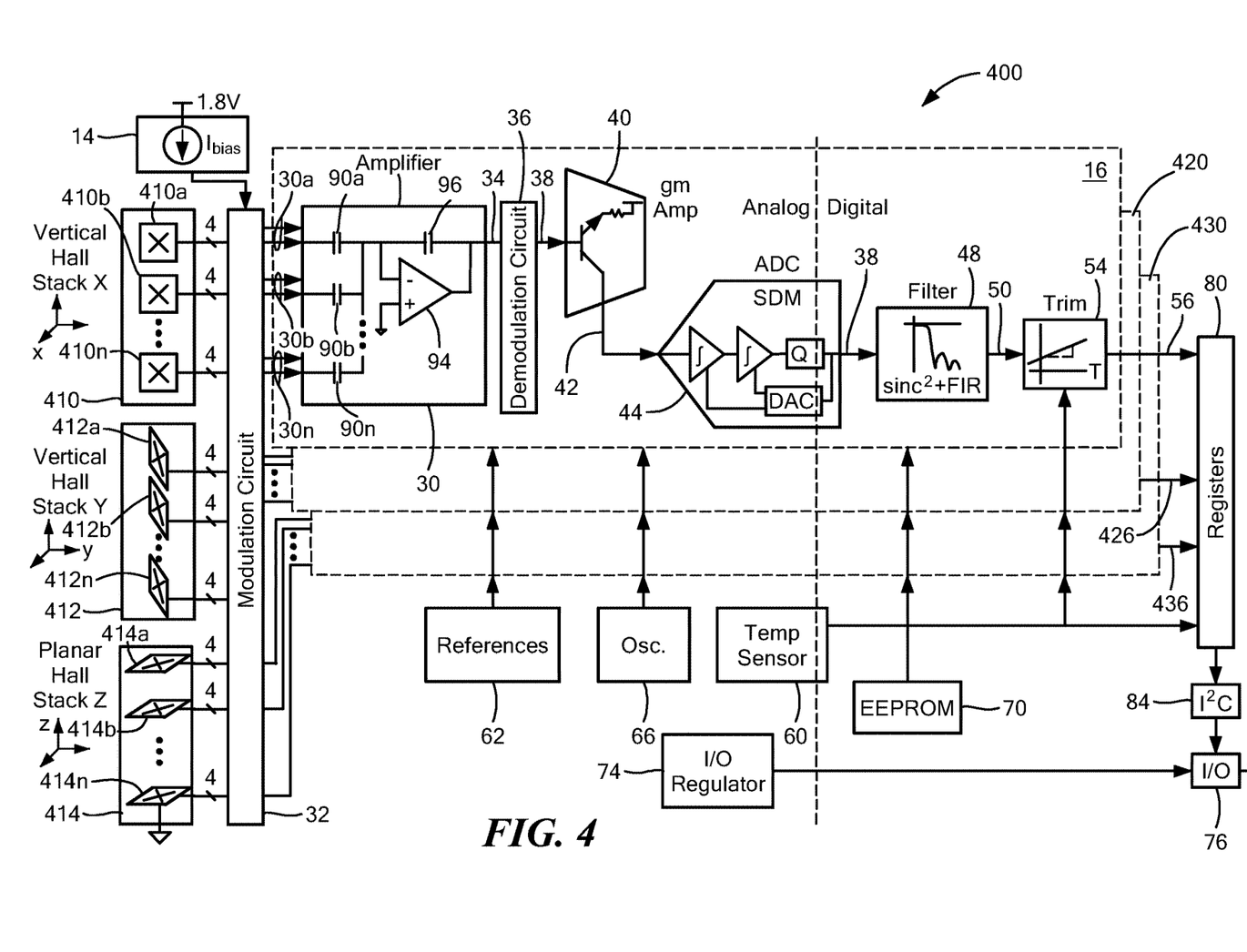
FIG. 4 is a block diagram of an alternative magnetic field sensor according to a further aspect of the disclosure.

Referring also to FIG. 4, according to a further aspect of the disclosure, a three-dimensional magnetic field sensor 400 is shown. Sensor 400 differs from sensor 10 (FIG. 1) in that three groups, or pluralities of transducers 410, 412, 414 are provided, each having a different axis of maximum sensitivity that is orthogonal with respect to the other two groups of transducers. To this end, transducer group 410, including transducers 410a, 410b, . . . 410n, can have an axis of maximum sensitivity along the x-axis, transducer group 412, including transducers 412a, 412b, . . . 412n, can have an axis of maximum sensitivity along the y-axis, and transducer group 414, including transducers 414a, 414b, . . . 414n, can have an axis of maximum sensitivity along the z-axis, as shown.

It will be appreciated by those of ordinary skill in the art that the transducers 410a, 410b, . . . 410n, 412a, 412b, . . . 412n, and 414a, 414b, . . . 414n can take various forms to achieve this relationship between their axes of maximum sensitivity. By way of a non-limiting example, the first plurality of transducers 410 can be vertical Hall elements, the second plurality of transducers 412 can be vertical Hall elements positioned orthogonally with respect to the first plurality of transducers, and the third plurality of transducers 414 can be planar Hall elements.

Each of the pluralities of transducers 410, 412, 414 can be processed by respective signal paths 16, 420, and 430. Signal path 16 can be the same as or similar to signal path 16 of FIG. 1. Signal paths 420, 430 can likewise be similar to signal path 16, but differ in that their input signals are modulated transducer output signals from respective pluralities of transducers 412, 414. Thus, the output signal 56 of signal path 16 can be indicative of magnetic field components along the x axis, the output signal 426 of signal path 420 can be indicative of magnetic field components along the y axis, and the output signal 436 of signal path 430 can be indicative of magnetic field components along the z axis. Additional elements of sensor 400 can be the same as or similar to elements with like reference numerals as FIG. 1 including bias current source 14, modulation circuit 32, references 62, oscillator 66, temperature sensor 60, I/O regulator 74, EEPROM 70, registers 80, I$^2$C circuit 84, and I/O driver 76.

All references cited herein are hereby incorporated herein by reference in their entirety.

Having described preferred embodiments, which serve to illustrate various concepts, structures and techniques, which are the subject of this patent, it will now become apparent that other embodiments incorporating these concepts, structures and techniques may be used. Accordingly, it is submitted that the scope of the patent should not be limited to the described embodiments but rather should be limited only by the spirit and scope of the following claims.

What is claimed is:

1. A magnetic field sensor, comprising:
    a current source configured to generate a bias current;
    a plurality of magnetic field transducers, each having power terminals coupled to the current source and output terminals at which an output signal of the transducer is provided, wherein the power terminals of each of the plurality of magnetic field transducers are electrically coupled together in series so that the bias current flows through each of the plurality of magnetic field transducers in series;
    a capacitively-coupled summing amplifier having a plurality of inputs, each configured to receive the output signal of a respective one of the plurality of magnetic field transducers, and an output at which an amplified and summed signal is provided, wherein the capacitively-coupled summing amplifier is configured to amplify and sum the received output signals of the plurality of magnetic field transducers;
    a modulation circuit coupled between the plurality of magnetic field transducers and the plurality of inputs of the capacitively-coupled summing amplifier, wherein the modulation circuit is configured to chop the output signal of each of the magnetic field transducers at a chopping frequency;
    a demodulation circuit configured to demodulate the amplified and summed signal at the chopping frequency to generate a demodulated signal;
    a transconductance amplifier having an input coupled to receive the demodulated signal and an output at which a voltage signal is provided;
    an analog-to-digital converter configured to convert the voltage signal into digital signal; and
    a filter coupled to receive the digital signal and configured to generate a filtered signal indicative of a magnetic field to which the plurality of magnetic field transducers are subjected.

2. The magnetic field sensor of claim 1, further comprising a trim circuit coupled to receive the filtered signal and configured to compensate for offset and gain errors in the filtered signal.

3. The magnetic field sensor of claim 2, further comprising a temperature sensor, wherein the trim circuit is configured to compensate for offset and gain errors caused by temperature variation.

4. The magnetic field sensor of claim 1, wherein the power terminals of adjacent ones of the plurality of magnetic field transducers are rotated by ninety-degrees with respect to each other.

5. The magnetic field sensor of claim 1, wherein the plurality of magnetic field transducers comprise Hall effect elements.

6. The magnetic field sensor of claim 1, wherein the plurality of magnetic field transducers comprise magnetoresistance elements.

7. The magnetic field sensor of claim 1, wherein the plurality of magnetic field transducers are oriented to have a maximum response along a first axis.

8. A magnetic field sensor, comprising:
    a current source configured to generate a bias current;
    a plurality of magnetic field transducers, each having power terminals coupled to the current source and output terminals at which an output signal of the transducer is provided, wherein the power terminals of each of the plurality of magnetic field transducers are electrically coupled together in series so that the bias current flows through each of the plurality of magnetic field transducers in series, wherein the plurality of magnetic field transducers are oriented to have a maximum response along a first axis, wherein the plurality of magnetic field transducers provide a first plurality of magnetic field transducers, wherein the magnetic field sensor further comprises a second plurality of magnetic field transducers having a maximum response axis along a second axis that is orthogonal with respect to the first axis along which the first plurality of magnetic field transducers have a maximum response; and
    a capacitively-coupled summing amplifier having a plurality of inputs, each configured to receive the output signal of a respective one of the plurality of magnetic field transducers, and an output at which an amplified and summed signal is provided, wherein the capacitively-coupled summing amplifier is configured to amplify and sum the received output signals of the plurality of magnetic field transducers.

9. The magnetic field sensor of claim 8, wherein the first plurality of magnetic field transducers comprise vertical Hall effect elements and wherein the second plurality of magnetic field transducers comprise planar Hall effect elements.

10. The magnetic field sensor of claim 8, wherein the first plurality of magnetic field transducers and the second plurality of magnetic field transducers comprise vertical Hall effect elements.

11. The magnetic field sensor of claim 8, further comprising a modulation circuit coupled between the plurality of magnetic field transducers and the plurality of inputs of the capacitively-coupled summing amplifier, wherein the modulation circuit is configured to chop the output signal of each of the magnetic field transducers at a chopping frequency.

12. The magnetic field sensor of claim 11, further comprising a demodulation circuit configured to demodulate the amplified and summed signal at the chopping frequency to generate a demodulated signal.

13. The magnetic field sensor of claim 12, further comprising:
    a transconductance amplifier having an input coupled to receive the demodulated signal and an output at which a voltage signal is provided;
    an analog-to-digital converter configured to convert the voltage signal into digital signal; and
    a filter coupled to receive the digital signal and configured to generate a filtered signal indicative of a magnetic field to which the plurality of magnetic field transducers are subjected.

14. The magnetic field sensor of claim 13, further comprising a trim circuit coupled to receive the filtered signal and configured to compensate for offset and gain errors in the filtered signal.

15. The magnetic field sensor of claim 14, further comprising a temperature sensor, wherein the trim circuit is configured to compensate for offset and gain errors caused by temperature variation.

16. The magnetic field sensor of claim 8, wherein the power terminals of adjacent ones of the plurality of magnetic field transducers are rotated by ninety-degrees with respect to each other.

17. The magnetic field sensor of claim 8, wherein the plurality of magnetic field transducers comprise Hall effect elements.

18. The magnetic field sensor of claim 8, wherein the plurality of magnetic field transducers comprise magnetoresistance elements.

19. A magnetic field sensor, comprising:
a current source configured to generate a bias current;
a plurality of magnetic field transducers, each having power terminals coupled to the current source and output terminals at which an output signal of the transducer is provided, wherein the power terminals of each of the plurality of magnetic field transducers are electrically coupled together in series so that the bias current flows through each of the plurality of magnetic field transducers in series, wherein the plurality of magnetic field transducers are oriented to have a maximum response along a first axis, wherein the plurality of magnetic field transducers provide a first plurality of magnetic field transducers, wherein the magnetic field sensor further comprises a second plurality of magnetic field transducers having a maximum response axis along a second axis that is orthogonal with respect to the first axis along which the first plurality of magnetic field transducers have a maximum response and a third plurality of magnetic field transducers having a maximum response axis along a third axis that is orthogonal with respect to the first and second axes; and
a capacitively-coupled summing amplifier having a plurality of inputs, each configured to receive the output signal of a respective one of the plurality of magnetic field transducers, and an output at which an amplified and summed signal is provided, wherein the capacitively-coupled summing amplifier is configured to amplify and sum the received output signals of the plurality of magnetic field transducers.

20. The magnetic field sensor of claim 19, wherein the first plurality of magnetic field transducers comprise planar Hall effect elements and the second plurality of magnetic field transducers and the third plurality of magnetic field transducers comprise vertical Hall effect elements.

* * * * *

UNITED STATES PATENT AND TRADEMARK OFFICE
CERTIFICATE OF CORRECTION

| | |
|---|---|
| PATENT NO. | : 11,408,945 B2 |
| APPLICATION NO. | : 16/951324 |
| DATED | : August 9, 2022 |
| INVENTOR(S) | : Craig Petrie et al. |

It is certified that error appears in the above-identified patent and that said Letters Patent is hereby corrected as shown below:

In the Specification

Column 6, Line 19 delete ". Transducers 20a, 20b, 20n" and replace with
--. Transducers 20a, 20b, . . . 20n--.

Column 8, Line 37 delete "terminal F," and replace with --terminal Γ,--.

Signed and Sealed this
Nineteenth Day of September, 2023

Katherine Kelly Vidal
*Director of the United States Patent and Trademark Office*